(12) United States Patent
Leung et al.

(10) Patent No.: US 6,538,477 B2
(45) Date of Patent: Mar. 25, 2003

(54) INPUT BUFFER FOR ANALOG-TO-DIGITAL CONVERTOR

(75) Inventors: Ka Y. Leung, Austin, TX (US); James L. Todsen, Tucson, AZ (US); Binan Wang, Tucson, AZ (US); Abdullah Yilmaz, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/918,402

(22) Filed: Jul. 30, 2001

(65) Prior Publication Data

US 2003/0020519 A1 Jan. 30, 2003

(51) Int. Cl.[7] .............................................. H03K 5/153
(52) U.S. Cl. .......................... 327/59; 327/67; 327/73; 327/87; 327/89; 330/254; 330/278
(58) Field of Search .............................. 327/59, 65, 66, 327/67, 72, 73, 77, 78, 87, 89, 96, 561, 563, 562; 330/254, 260, 278, 259

(56) References Cited

U.S. PATENT DOCUMENTS

| 4,427,903 A | * | 1/1984 | Sugimoto | 327/103 |
| 4,539,491 A | * | 9/1985 | Nishioka et al. | 327/103 |
| 4,714,845 A | * | 12/1987 | Devecchi et al. | 327/333 |
| 5,644,257 A | | 7/1997 | Kerth et al. | 327/96 |

FOREIGN PATENT DOCUMENTS

| JP | 63-92108 | * | 4/1988 | ............. H03F/3/45 |

OTHER PUBLICATIONS

Hogenauer Eugene B., "An Economical Class of Digital Filters for Decimation and Interpolation," IEEE Transactions on Acoustics, Speech, and Signal Processing, vol. ASSP–29, No. 2, Apr. 1981, pp. 155–162.

* cited by examiner

Primary Examiner—Tuan T. Lam
(74) Attorney, Agent, or Firm—W. Daniel Swayze, Jr.; W. James Brady; Frederick J. Telecky, Jr.

(57) ABSTRACT

An input buffer circuit for use with an analog-to-digital converter is provided. The input buffer circuit comprises a first amplifier configured with a second amplifier to improve the overall gain of the input buffer circuit. The first amplifier comprises a differential pair of transistors configured with a second pair of transistors comprising a current mirror arrangement, wherein one of the differential pair of transistors of the first amplifier is configured in a diode-connected arrangement to provide a first feedback loop, while the second amplifier comprises a differential pair of transistors configured with another pair of transistors also comprising a current mirror arrangement, with the second amplifier and the current mirror arrangement of the first amplifier comprising a second feedback loop. Further, the first amplifier is configured such that the differential pair of transistors comprise different sized transistor devices, thus creating an offset voltage which permits the input voltage to swing close to ground, and which maintains the output voltage at voltage level higher than the input voltage by the amount of the offset voltage.

18 Claims, 3 Drawing Sheets

INPUT BUFFER FOR ANALOG-TO-DIGITAL CONVERTOR

FIELD OF INVENTION

The present invention relates to an input buffer for use in analog-to-digital converters. More particularly, the present invention relates to an input buffer circuit having high linearity, good noise performance and voltage swing capability and configured for increasing the input impedance of an analog-to-digital converter.

BACKGROUND OF THE INVENTION

The demand for more reliable integrated circuit components for use in communication, instrumentation and high-quality video applications continues to increase. As a result, integrated circuit manufacturers are requiring for such components and devices to meet the design requirements of a myriad of emerging applications. In particular, integrated circuit manufacturers are requiring analog-to-digital converters and related components to continue to improve data rates, noise reduction, and accuracy.

An increasingly popular technique used in improving the characteristics of analog to-digital converters includes the use of delta-sigma modulation wherein an analog voltage is input to a delta-sigma modulator, and the output can be digitally filtered to remove the noise. In analog-to-digital converters, such as delta-sigma A/D converters, the analog input signal must usually be sampled. To facilitate the sampling of the analog signal, A/D converters typically implement one of various switched-capacitor techniques.

With reference to FIG. 1, an example of switch-sampling circuit 100 having a sampling capacitor $C_S$, with switches $S_1$ and $S_2$ being configured for receiving and sampling an input voltage $V_{IN}$, is illustrated. During a phase one, switches $S_1$ are closed and capacitor $C_S$ is charged up to a voltage. During a phase two, switches $S_1$ are opened, switches $S_2$ are closed, and the charge in capacitor $C_S$ is provided to a summing node of the first integrator in the delta-sigma analog-to-digital converter. The analog-to-digital converter can then compare the voltage charge to an input reference voltage $V_{REF}$ to facilitate the determination of the digital representation of the input voltage $V_{IN}$.

In such a switched-sampling circuit 100, the input voltage $V_{IN}$ must be configured for providing the charge supplied to the sampling capacitor $C_S$. The more frequently sampling circuit 100 is switched, the more charge that must be supplied to the sampling capacitor $C_S$, thus increasing the demands on the input voltage $V_{IN}$ for driving the sampling capacitor $C_S$. To lessen the load on the input voltage $V_{IN}$, many analog-to-digital converters include a buffer amplifier 102 for isolating the input voltage $V_{IN}$ from sampling circuit 100.

It is highly desirable that the buffer amplifier 102 maintain good linearity and noise performance, i.e., no degradation of the linearity or noise performance, as well as be able to swing close to ground during operation. Various configurations exist for providing input buffer amplifiers, but each of these configurations have one or more shortcomings.

For example, to obtain high linearity at low frequency, a high gain amplifier is needed within buffer amplifier 102. One approach for providing this high gain characteristic can be achieved by cascading multiple gain stages to provide a high gain amplifier. However, such a cascading configuration requires frequency compensation to maintain stable feedback conditions. Further, such a cascading configuration produces undesirable wideband noise from the buffer amplifier 102 to switched-sampling circuit 100. Another approach includes the implementation of cascode circuits in a single stage amplifier. Such a cascode configuration is generally limited when using a low power supply, wherein the voltage drop caused by stacking the cascode devices severely reduces the input signal range.

Another configuration for buffer amplifier 102, disclosed in U.S. Pat. No. 5,644,257 to Kerth et al. ("Kerth"), provides a circuit configured for reducing the effects of a non-linear anti-aliasing network. The Kerth configuration utilizes a primary and secondary input path, wherein the secondary input path is turned on initially to provide the charging for the parasitic capacitance and to replenish the channeling charge lost in a previous sampling cycle, i.e., a "course" tuning of buffer amplifier 102. Meanwhile, the primary input path is configured to provide the charge required by the sampling capacitor $C_S$, i.e., to "fine" tune the voltage levels within switched-sampling circuit 100 during sampling operation. However, the Kerth configuration does not reduce or eliminate the loading on the input voltage terminal $V_{IN}$.

Accordingly, a need exists for an input buffer circuit configured for increasing the input impedance of an analog-to-digital converter, and thus reducing the load on the input buffer circuit. In addition, a need exists for an improved input buffer configuration that provides high linearity and good noise performance, and can be configured to swing close to ground during operation.

SUMMARY OF THE INVENTION

The input buffer circuit according to the present invention addresses many of the shortcomings of the prior art. In accordance with various aspects of the present invention, an input buffer circuit is configured to increase the input impedance of a switched-capacitor circuit, for example a switched-capacitor circuit of an analog-to-digital converter, and thus reduce the loading of the input voltage terminal $V_{IN}$. In accordance with one aspect of the present invention, an input buffer circuit comprises a first amplifier configured with a second single stage amplifier to improve the overall gain of the input buffer circuit. In accordance with an exemplary embodiment, the first amplifier comprises a differential pair of transistors configured with a second pair of transistors comprising a current mirror arrangement, wherein one of the differential pair of transistors of the first amplifier is configured in a diode-connected arrangement to provide a first feedback loop, while the second amplifier comprises a differential pair of transistors configured with another pair of transistors also comprising a current mirror arrangement, with the second amplifier and the current mirror arrangement of the first amplifier comprising a second feedback loop.

In accordance with another aspect of the present invention, the input buffer circuit can be configured to maintain high linearity within the analog-to-digital converter. In accordance with this aspect, the input buffer circuit is suitably configured such that the drain-source voltages of the differential pair of transistors of the first amplifier are maintained at a constant, equal magnitude of voltage. As a result, any change in voltage appearing at the input terminal of the first amplifier will appear as a corresponding linear change in voltage on the output terminal of the first amplifier.

In accordance with another aspect of the present invention, the input buffer circuit is configured to maintain the noise performance within the analog-to-digital converter. In accordance with this aspect, the input buffer circuit is configured with the second feedback loop operating within the first feedback loop such that the input buffer circuit functions as a single stage amplifier, and thus does not degrade the noise performance of the analog-to-digital converter.

In accordance with another aspect of the present invention, the input buffer circuit is configured to swing substantially close to ground during operation. In accordance with this aspect of the present invention, the first amplifier is configured such that the differential pair of transistors comprise different sized transistor devices. Since the gate-source voltage $V_{GS}$ is inversely proportional to the device size, the gate-source voltage $V_{GS}$ of one transistor of the differential pair is smaller than the gate-source voltage $V_{GS}$ of the other transistor, thus creating an offset voltage which permits the input voltage to swing close to ground, and which maintains the output voltage at a voltage level higher than the input voltage by the amount of the offset voltage.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

Figure 1:
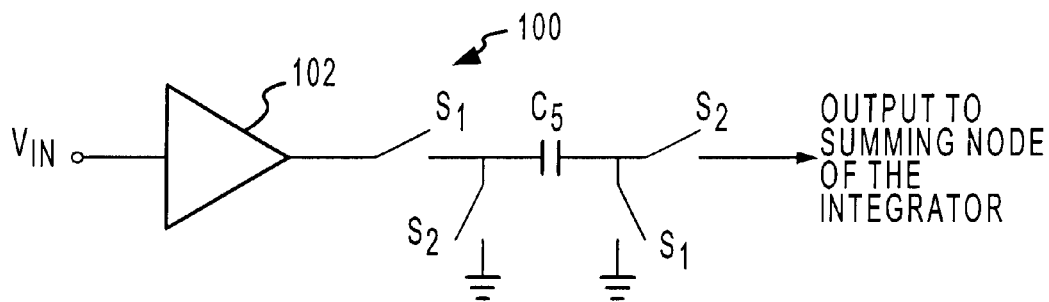
FIG. 1 illustrates a block diagram of a prior art input buffer and switched-sampling circuit.

The present invention may be described herein in terms of various functional components and various processing steps. It should be appreciated that such functional components and functions may be realized by any number of hardware or structural components configured to perform the specified functions. For example, the present invention may employ various integrated components, e.g., buffers, supply references, current mirrors, signal processors and the like, comprised of various electrical devices, e.g., resistors, transistors, capacitors, diodes and other components whose values may be suitably configured for various intended purposes. In addition, the present invention may be practiced in any integrated circuit application where an input buffer can be utilized. Such general applications that may be appreciated by those skilled in the art in light of the present disclosure are not described in detail herein. However for purposes of illustration only, exemplary embodiments of the present invention will be described herein in connection with a delta-sigma analog-to-digital converter. Further, it should be noted that while various components may be suitably coupled or connected to other components within exemplary circuits, such connections and couplings can be realized by direct connection between components, or by connection or coupling through other components and devices located there between.

As discussed above, prior art techniques for providing an input buffer for isolating an input voltage terminal from an switched-sampling circuit within an analog-to-digital converter are limited. For example, prior art techniques have difficulty in maintaining high linearity and good noise performance, and generally require a higher power supply. Moreover, the prior art techniques do not eliminate or substantially reduce the loading on the input of the analog-to-digital converter. However, in accordance with various aspects of the present invention, an input buffer circuit is configured to increase the input impedance of the switched-sampling circuit of an analog-to-digital converter, and thus reduce the loading of the input voltage terminal $V_{IN}$. In accordance with one aspect of the present invention, an input buffer circuit can comprise a second amplifier configured with a first amplifier to improve the overall gain of the input buffer.

In accordance with an exemplary embodiment, the first single stage amplifier comprises at least one pair of transistors configured in a differential pair arrangement, with the differential pair of transistors having a first feedback loop, i.e., one of the differential pair of transistors is configured in a diode-connected arrangement such that an input is connected to an output of the first single stage amplifier. In addition, the first single stage amplifier can also comprise a current mirror configured to force the current through each of the transistors in the differential pair to be equal.

The second amplifier suitably comprises a $g_m$ amplifier configured to provide additional DC and low frequency gain to the input buffer circuit. The second amplifier can comprise various amplifier configurations. In accordance with an exemplary embodiment, the second amplifier comprises at least one differential pair of transistors configured with the current mirror of the first single stage amplifier to provide a second feedback loop with the first single stage amplifier. As a result of the feedback loop configurations, the gain from the differential-to-common-mode feedback of the second amplifier and current mirror suitably adds two gain-stages to the first single stage amplifier. Moreover, the bandwidth and phase shift characteristics of the input buffer function as a single stage amplifier.

Figure 2:
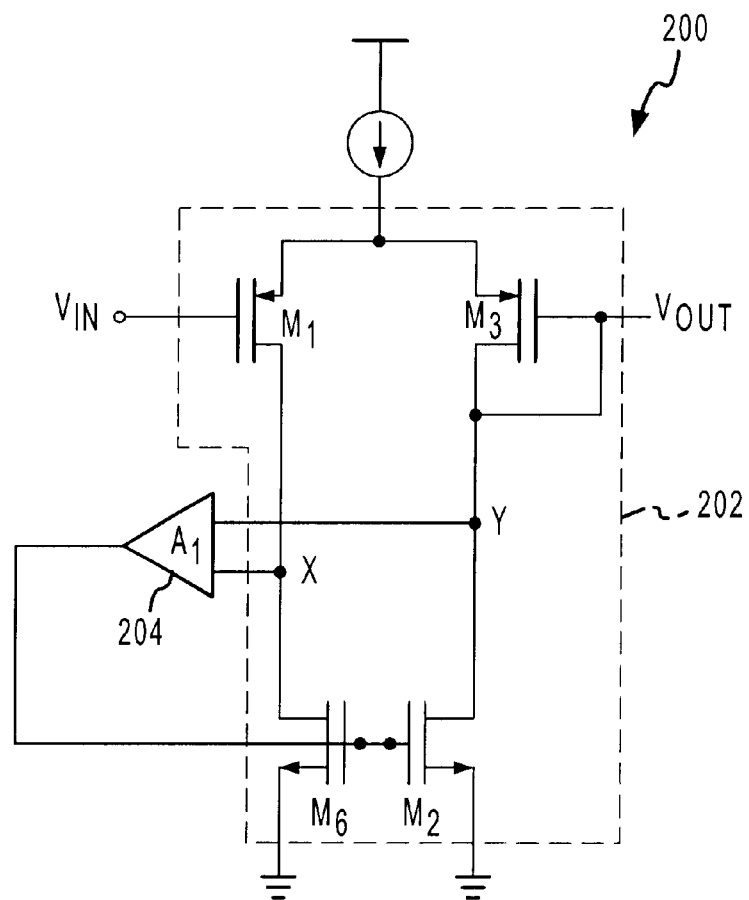
FIG. 2 illustrates an exemplary input buffer circuit in accordance with an exemplary embodiment of the present invention.

With reference to FIG. 2, in accordance with an exemplary embodiment, an input buffer 200 configured for increasing in input impedance of an analog-to-digital converter is illustrated. In accordance with this embodiment, input buffer 200 suitably comprises a first amplifier 202 and a second amplifier 204 configured in an arrangement for improving the overall gain of first amplifier 202. First amplifier 202 suitably comprises a first pair of transistors, $M_1$ and $M_3$, configured in a differential pair arrangement, with the source of each transistor $M_1$ and $M_3$ configured for coupling to a current source, $I_{S1}$. In accordance with the exemplary embodiment, transistors $M_1$ and $M_3$ comprise p-channel transistors. First amplifier 202 is configured with an input terminal $V_{IN}$ coupled to the gate electrode of transistor $M_1$. Transistor $M_3$ is configured to provide a first feedback loop, with the drain of transistor $M_3$ suitably connected to the gate electrode of transistor $M_3$, i.e., transistor $M_3$ is configured in a diode-connected arrangement. Accordingly, first amplifier 200 is configured with an output terminal VOUT configured at the gate electrode of transistor $M_3$.

In accordance with the exemplary embodiment, first amplifier 202 can also include a second pair of transistors $M_2$ and $M_6$ configured in a current mirror arrangement. In the current mirror pair, the current in transistor $M_6$ can be suitably mirrored to transistor $M_2$. As a result, the current flowing in transistors $M_1$ and $M_3$ can be forced to an equal magnitude.

Second amplifier 204 can suitably comprise a $g_m$ amplifier configured to provide additional DC and low frequency gain to the input buffer circuit. In accordance with the exemplary embodiment, second amplifier 204 includes an output that is configured to drive the gate electrodes of transistors $M_2$ and $M_6$. In accordance with this embodiment, second amplifier 204 is coupled to the current mirror pair, for example, to transistor $M_6$, to provide a second feedback loop with first amplifier 202, i.e., second amplifier 204 and transistor $M_6$ comprise a second feedback loop operating within the first feedback loop of first amplifier 202. As a result of the feedback loop configurations, the gain from the differential-to-common-mode feedback of the second amplifier 204 and the current mirror pair suitably adds two gain-stages to first single stage amplifier 202.

In accordance with another aspect of the present invention, input buffer 200 can be configured to maintain high linearity within an analog-to-digital converter. In accordance with this aspect of the present invention, input buffer 200 is suitably configured such that the drain-source voltages, $V_{DS}$, of each transistor $M_1$ and $M_3$ of the differential pair are maintained at a constant, equal magnitude of voltage. As a result, any change in voltage appearing at the input terminal $V_{IN}$ of first amplifier 202, i.e., at the gate electrode of transistor $M_1$, will appear as a corresponding linear change in voltage on the output/terminal $V_{OUT}$ of first amplifier 202, i.e., at the gate electrode of transistor $M_3$. In addition, any second order effects that can introduce linearity problems into input buffer 200 can be substantially mitigated.

In accordance with this aspect of the present invention, to maintain the drain-source voltage, $V_{DS}$, of each transistor $M_1$ and $M_3$ at a constant, equal magnitude of voltage, second amplifier 204 suitably comprises a first input connected to the drain of transistor $M_1$, for example at node X, and a second input connected to the drain of transistor $M_3$, for example at node Y. As a result of the second feedback loop operating within the first feedback loop of first amplifier 202, the voltage at node X is forced equal in magnitude to the voltage at node Y. In addition, as a result of second amplifier 204 maintaining constant the drainsource voltages, $V_{DS}$, of each transistor $M_1$ and $M_3$, any errors resulting from the output impedances of transistors $M_1$ and $M_3$ can be significantly reduced. Accordingly, high linearity in input buffer 200 can be realized, i.e., any change in voltage appearing at the input terminal $V_{IN}$ will appear as a corresponding linear change in voltage on the output terminal $V_{OUT}$.

Second amplifier 204 can be configured in various arrangements for maintaining constant the drain-source voltages of the differential pair of first amplifier 202. For example, with reference to FIG. 3, an exemplary second amplifier 300 is illustrated. Second amplifier 300 suitably comprises a first pair of transistors $M_4$ and $M_5$ configured in a differential pair arrangement, with the sources of transistors $M_4$ and $M_5$ coupled to a current source $I_{S2}$, and the gate electrodes configured for coupling to the drains of the differential pair of first amplifier 202. In addition, second amplifier 300 suitably comprises a second pair of transistors $M_7$ and $M_8$ configured in a current mirror arrangement, with the respective gate electrodes of transistors $M_7$ and $M_8$ and the drain of transistor $M_8$ connected together, i.e., transistor $M_8$ is connected as a diode, and with the respective sources of transistors $M_7$ and $M_8$ connected to ground. Accordingly, second pair of transistors $M_7$ and $M_8$ are configured such that the current in transistors $M_4$ and $M_5$ are equal in magnitude.

Figure 3:
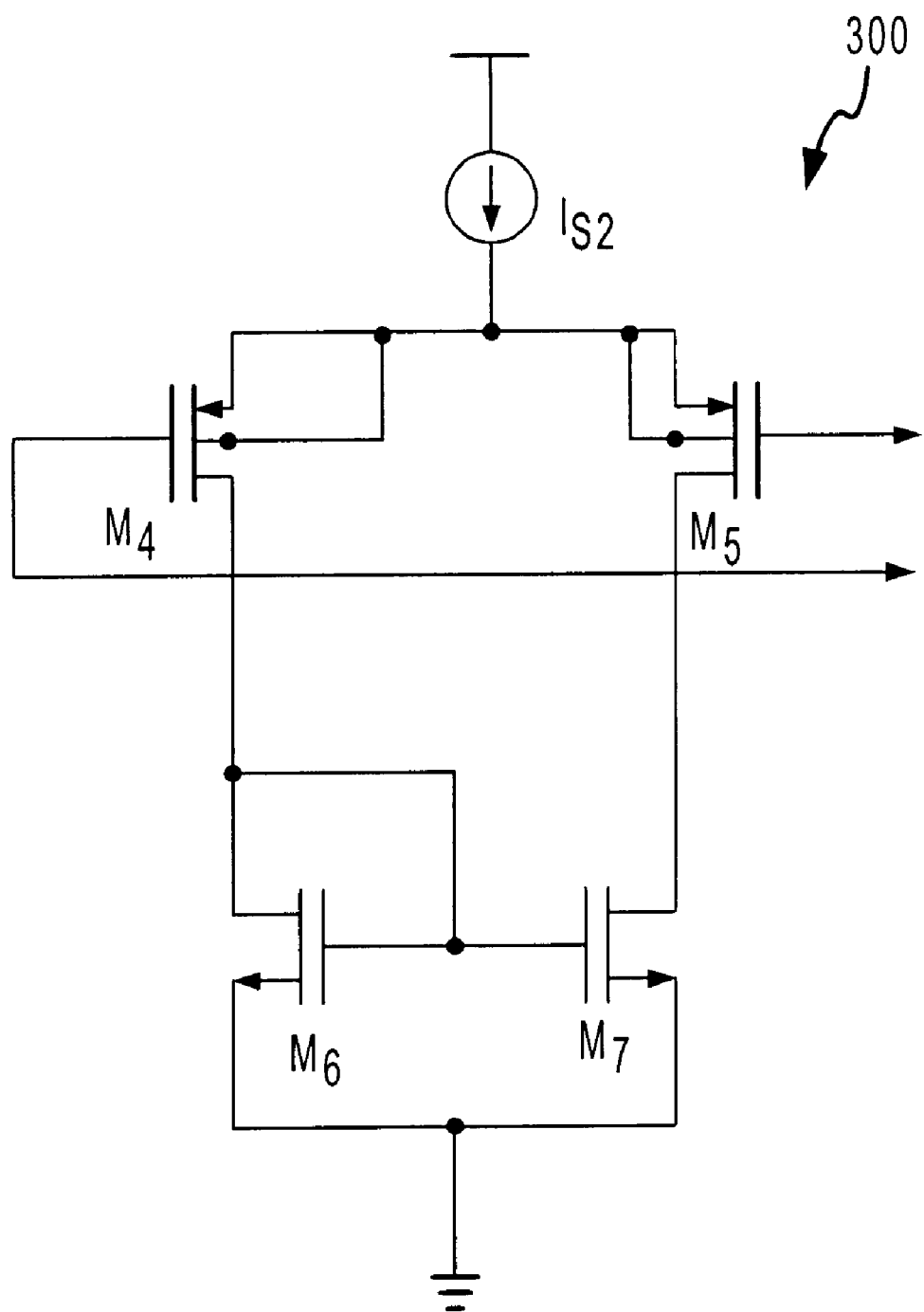
FIG. 3 illustrates an exemplary amplifier stage as may be configured within an input buffer circuit in accordance with an exemplary embodiment of the present invention.

It should be noted that although a differential pair and current mirror configuration, second amplifier 204 is not limited to the exemplary embodiment illustrated in FIG. 3. In other words, second amplifier 204 can comprise any amplifier configuration for providing additional DC and low frequency gain to the input buffer circuit, such as by providing a second feedback loop with the first single stage amplifier, thus adding two gain-stages to the first single stage amplifier.

In accordance with another aspect of the present invention, the input buffer circuit 200 is configured to permit the input voltage at terminal $V_{IN}$ to swing substantially close to ground during operation. In accordance with this aspect of the present invention, first amplifier 202 is configured such that transistors $M_1$ and $M_3$ comprise different sized transistor devices. In accordance with an exemplary embodiment, transistor $M_3$ is configured with a larger device size than transistor $M_1$. For example, transistor $M_3$ may comprise a device area fifteen times or more larger than the device area of transistor $M_1$. Since the gate-source voltage $V_{GS}$ is inversely proportional to the device size, the gate-source voltage $V_{GS}$ of transistor $M_3$ is smaller than the gate-source voltage $V_{GS}$ of transistor $M_3$, thus creating an offset voltage which permits the input voltage $V_{IN}$ to swing close to ground, and maintains the output voltage $V_{OUT}$ at a voltage level higher than the input voltage $V_{IN}$ by the amount of the offset voltage.

To illustrate this aspect of the present invention, the output voltage at terminal $V_{OUT}$ can be expressed as:

$$V_{OUT} = V_{IN} + V_{OFFSET}$$

wherein, a fixed offset voltage $V_{OFFSET}$, comprising the differences in the gate-source voltage $V_{GS}$ of transistors $M_1$ and $M_3$, can be provided to permit input voltage $V_{IN}$ to swing close, or even below, ground, while the output voltage $V_{OUT}$ remains above ground. Accordingly, by configuring transistors $M_1$ and $M_3$ with different sized device areas, the input voltage at input terminal can swing close to ground, or even below ground, without requiring the output terminal to swing below ground.

While the above exemplary embodiment provides for transistor $M_3$ to have a device area approximately fifteen times or more larger than the device area of transistor $M_1$, it should be noted that first amplifier 202 is not limited to that range of size differences, and comprise any different size configuration. For example, transistor $M_3$ can have a device area slightly smaller than, the same as, or slightly larger than the device area of transistor $M_1$. However, by increasing the device area of transistor $M_3$, the ability to permit the input voltage at input terminal $V_{IN}$ to swing can be improved. In addition, transistor $M_3$ can have a device area significantly larger than the device area of transistor $M_1$, for example, up to 100 times or more. However, it should be noted that diminishing returns are realized for size ratios greater than fifteen or more, i.e., the benefit is permitted voltage swing of the input terminal is offset by the increase in device area required by transistor $M_3$.

As discussed above, by introducing an input buffer circuit to an analog-to-digital converter, particularly with additional amplifier stages, the noise performance of the analog-to-digital converter can suffer. For example, while the switched sampling circuit can include switching noise, such as kT/C noise and the like, the two-or more stage buffer configurations can introduce significantly larger noise components that will dominate the noise performance of the analog-to-digital converter. However, in accordance with another aspect of the present invention, the input buffer circuit is configured to maintain the noise performance within the analog-to-digital converter. In accordance with this aspect of the present invention, rather than utilizing a two-stage amplifier design, input buffer 200 is configured with the first and second feedback loops to function as a single stage amplifier. As a result, the switching noise component, e.g., kT/C, will suitably dominate over any noise contribution from input buffer 200, and thus the noise performance can be suitably maintained.

Having described various exemplary embodiments for input buffer 200, including first amplifier 202 and second amplifier 204, a more detailed exemplary embodiment will be provided. However, it should again be noted that the following exemplary embodiments are for the purposes of illustration, and the input buffer of the present invention can comprise various other configurations.

Figure 4:
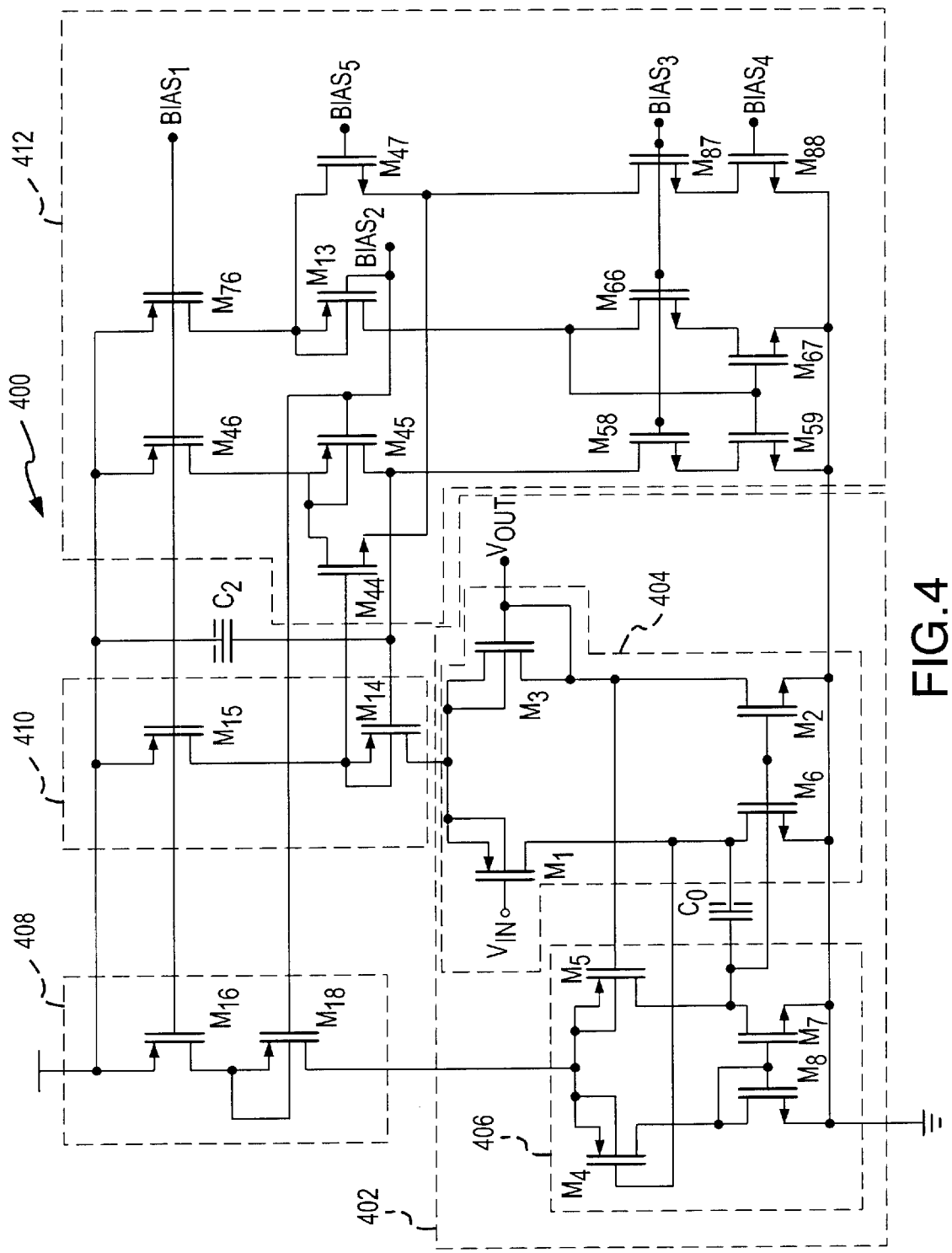
FIG. 4 illustrates an exemplary input buffer circuit in accordance with another exemplary embodiment of the present invention.

With reference to FIG. 4, an input buffer circuit 400 suitably comprises a pair of current sources 408 and 410, a biasing circuit 412, and an input buffer 402, with input buffer 402 suitably comprising a first $g_m$ amplifier 404 and a second $g_m$ amplifier 406.

Current sources 408 and 410 are suitably configured to provide a current source from supply rails to input buffer 402, e.g., current source 408 is coupled to second amplifier 406, and current source 410 is coupled to first amplifier 404. In addition, current sources 408 and 410 can comprise various configurations. For example, with reference to FIG. 4, current sources 408 and 410 can comprise a pair of p-channel transistors configured in a series arrangement, with the source of one transistor connected to the supply rail, and the drain of the other transistor connected to the respective amplifiers 404 and 406 of input buffer 402. Moreover, current sources 408 and 410 can comprise regulated cascode current sources to provide tail currents to first amplifier 404 and second amplifier 406. In addition, the gate electrodes of current sources 408 and 410 are suitably coupled to biasing circuit 412.

Biasing circuit 412 is suitably configured to provide biasing to the current sources 408 and 410 of input buffer circuit 400. Biasing circuit 412 suitably comprises a biasing gain boosted amplifier circuit configured to improve the performance of current source 410. In accordance with an exemplary embodiment, biasing network 412 comprises several biasing input terminals, e.g., $BIAS_1$ through $BIAS_5$ terminals, for biasing current sources 408 and 410. Accordingly, by providing current sources 408 and 410 with a very high output impedance, good linearity can be achieved in input buffer circuit 400.

In addition to biasing network 412, input buffer circuit 400 can also include a capacitor network coupled between the supply rail and current source 410. For example, a capacitor $C_2$ can be suitably configured between the supply rail and the gate electrode of the second transistor of current source 410. As a result, capacitor C2 can suitably provide compensation for the gain boosted amplifier circuit within biasing circuit 412.

Input buffer 402 suitably includes first amplifier 404 and second amplifier 406 configured in a gain boosting arrangement, such as described above with respect to the first feedback loop and second feedback loop for amplifiers 202 and 204. In accordance with this exemplary embodiment, first amplifier 404 and second amplifier 406 can comprise amplifier arrangements similar to first amplifier 202 and second amplifier 204, e.g., first amplifier 404 can comprise transistors $M_1$, $M_2$, $M_3$ and $M_6$ while second amplifier can comprise transistors $M_4$, $M_5$, $M_7$ and $M_8$.

In accordance with another exemplary embodiment, input buffer 402 can be configured to reduce the phase shift contribution of second amplifier 406 with respect to first amplifier 404. In accordance with this exemplary embodiment, input buffer 400 suitably includes a capacitor network connected between second amplifier 406 and first amplifier 404. For example, with reference to FIG. 4, input buffer 402 suitably comprises a capacitor $C_0$ configured between the drains of transistors $M_6$ and $M_7$. In accordance with this exemplary embodiment, capacitor $C_0$ can comprise various values, for example 50 pF to 1 pF or even smaller.

Although capacitor $C_0$ is illustrated in connection between the drains of transistors $M_6$ and $M_7$, capacitor $C_0$ could also be configured in other arrangements between first amplifier 404 and second amplifier 406 that are configured to reduce the phase shift contribution of second amplifier 404 to first amplifier 406. In addition to the reduction of the phase shift contribution of second amplifier 406, capacitor $C_0$ also is configured to compensate the second feedback loop provided by second amplifier 406 and transistor $M_6$ of first amplifier 404. Moreover, capacitor $C_0$ can also facilitate better stability of input buffer 400 at high frequency.

The present invention has been described above with reference to an exemplary embodiment. However, those skilled in the art will recognize that changes and modifications may be made to the exemplary embodiment without departing from the scope of the present invention. For example, the various components may be implemented in alternate ways, such as, for example, with the p-channel transistors being replaced by n-channel transistors in accordance with other exemplary embodiments. These alternatives can be suitably selected depending upon the particular application or in consideration of any number of factors associated with the operation of the system. In addition, the techniques described herein may be extended or modified for use with other components besides an analog-to-digital converter. These and other changes or modifications are intended to be included within the scope of the present invention, as expressed in the following claims.

What is claimed is:

1. An input buffer circuit for use in a switched-capacitor circuit, said input buffer circuit comprising:
   a first amplifier configured for receiving an input voltage, said first amplifier comprising a first differential pair of transistors and a second pair of transistors comprising a first current mirror, wherein one of said first differential pair of transistors comprises a diode-connected arrangement to provide a first feedback loop;
   a second amplifier configured for providing a gain boosting function to said first amplifier, said second amplifier comprising a second differential pair of transistors and a third pair of transistors comprising a second current mirror, said second amplifier configured for driving said second pair of transistors of said first amplifier; and
   wherein said second amplifier and one transistor of said second pair of transistors comprises a second feedback loop, said second feedback loop operating within said first feedback loop such that said input buffer circuit operates as a single stage amplifier, and wherein said second amplifier provides gain-boosting to said first amplifier.

2. An input buffer circuit according to claim 1, wherein gate electrodes of said second differential pair of transistors are connected to drains of said first differential pair such that the drain-source voltage of each transistor of said first differential pair are maintained at an equal magnitude of voltage, and thus facilitate high linearity.

3. An input buffer circuit according to claim 1, wherein said first differential pair of transistors comprise different sized transistor devices to create an offset voltage that facilitates the capability of the input voltage to swing approximate to ground.

4. An input buffer circuit according to claim 3, wherein said first differential pair of transistors comprise a first transistor having a gate electrode configured to provide an input voltage terminal, and a second transistor having a gate electrode configured to provide an output voltage terminal, and wherein said first transistor has a device area at least 5 times greater than the device area of said second transistor.

5. An input buffer circuit according to claim 1, wherein said input buffer circuit further comprises:
   a first current source for providing current to said first amplifier, said first current source being connected to each source of said first differential pair; and
   a second current source for providing current to said second amplifier, said second current source being connected to each source of said second differential pair.

6. An input buffer circuit according to claim 5, wherein said input buffer circuit further comprises a biasing network coupled to said first current source and said second current source.

7. An input buffer circuit according to claim 1, wherein said input buffer circuit further comprises a capacitor network coupled between said second amplifier and said first amplifier to reduce the phase shift contribution of said second amplifier with respect to said first amplifier.

8. An analog-to-digital converter having an input buffer configured for increasing an input impedance of the analog-to-digital converter, said input buffer comprising:
   a first amplifier configured for receiving an input voltage, said first amplifier comprising a first differential pair of transistors and a second pair of transistors comprising a first current mirror, wherein one of said first differential pair of transistors comprises a diode-connected arrangement to provide a first feedback loop;
   a second amplifier configured for providing a gain boosting function to said first amplifier, said second amplifier comprising a second differential pair of transistors and a third pair of transistors comprising a second current mirror, said second amplifier configured for driving said second pair of transistors of said first amplifier; and
   wherein said second amplifier and one transistor of said second pair of transistors comprises a second feedback loop, said second feedback loop operating within said first feedback loop such that said input buffer circuit operates as a single stage amplifier, and wherein said second amplifier provides gain-boosting to said first amplifier.

9. An analog-to-digital converter according to claim 8, wherein gate electrodes of said second differential pair of transistors are connected to drains of said first differential pair such that the drain-source voltage of each transistor of said first differential pair are maintained at an equal magnitude of voltage, and thus facilitate high linearity.

10. An analog-to-digital converter according to claim 8, wherein said first differential pair of transistors comprise different sized transistor devices to create an offset voltage that facilitates the capability of the input voltage to swing approximate to ground.

11. An analog-to-digital converter according to claim 8, wherein said second amplifier comprises an output configured to drive gate electrodes of said second pair of transistors.

12. An analog-to-digital converter according to claim 8, wherein said input buffer further comprises a capacitor network coupled between a drain of said third pair of transistors and a drain of said second pair of transistors, said capacitor network configured to reduce the phase shift contribution of said second amplifier with respect to said first amplifier.

13. An input buffer for use with an analog-to-digital converter, said input buffer comprising:
   a first amplifier comprising a first transistor and a second transistor configured in a differential pair arrangement, said first transistor having a gate electrode configured for receiving an input voltage and said second transistor having a gate electrode coupled to provide an output voltage, said first amplifier further comprising a third transistor and a fourth transistor configured in a current mirror arrangement to provide equal currents in said first transistor and said second transistor;
   a second amplifier comprising a fourth transistor and a sixth transistor configured in a differential pair arrangement, said fourth transistor comprising a gate electrode connected to a drain of said first transistor, and said fifth transistor comprising a gate electrode connected to a drain of said second transistor, said second amplifier further comprising a sixth transistor and an seventh transistor configured in a current mirror arrangement; and
   wherein said second amplifier is configured with said first amplifier to maintain an equal drain-source voltage for each of said first transistor and said second transistor to facilitate high linearity within said input buffer.

14. An input buffer according to claim 13, wherein said input buffer further comprises:
   a first feedback loop comprising said second transistor configured in a diode connected arrangement; and
   a second feedback loop comprising said second amplifier and said third transistor, said second feedback loop configured to operate within said first feedback loop such that said input buffer functions as a single stage amplifier.

15. An input buffer according to claim 13, wherein said second transistor has a device area larger than a device area of said first transistor to create an offset voltage that increases the capability of the input voltage to swing to ground.

16. An input buffer according to claim 15, wherein said the device area of said second transistor is at least five times larger than the device area of said first transistor.

17. An input buffer according to claim 13, wherein said second amplifier comprises an output configured to drive gate electrodes of said third transistor and said fourth transistor.

18. An input buffer according to claim 13, wherein said input buffer further comprises a capacitor network coupled between a drain of said eighth transistor and a drain of said third transistor to reduce the phase shift contribution of said second amplifier with respect to said first amplifier.

* * * * *